United States Patent

König et al.

Patent Number: 5,503,913
Date of Patent: Apr. 2, 1996

[54] TOOL WITH WEAR-RESISTANT CUTTING EDGE MADE OF CUBIC BORON NITRIDE OR POLYCRYSTALLINE CUBIC BORON NITRIDE, A METHOD OF MANUFACTURING THE TOOL AND ITS USE

[75] Inventors: Udo König, Essen; Ralf Tabersky, Bottrop, both of Germany

[73] Assignee: Widia GmbH, Essen, Germany

[21] Appl. No.: 175,409

[22] PCT Filed: Jul. 23, 1992

[86] PCT No.: PCT/DE92/00608

§ 371 Date: Dec. 30, 1993

§ 102(e) Date: Dec. 30, 1993

[87] PCT Pub. No.: WO93/04015

PCT Pub. Date: Mar. 4, 1993

[30] Foreign Application Priority Data

Aug. 14, 1991 [DE] Germany .................. 41 26 851.2

[51] Int. Cl.⁶ .................. C04B 41/89; C23C 28/00; C23C 16/40
[52] U.S. Cl. .................. 428/216; 51/295; 51/307; 51/309; 427/255.3; 427/255.7; 427/569; 427/578; 427/585; 427/590; 428/212; 428/469; 428/648; 428/701; 428/702
[58] Field of Search .................. 428/216, 698, 428/701, 702, 212, 469; 51/295, 307, 309, 255.3, 255.7; 427/569, 578, 585, 590

[56] References Cited

U.S. PATENT DOCUMENTS

| | | | |
|---|---|---|---|
| 4,297,387 | 10/1981 | Beale | 427/38 |
| 4,526,673 | 7/1985 | Little et al. | 204/192 E |
| 4,652,277 | 3/1987 | Makhlouf et al. | 51/309 |
| 4,657,774 | 4/1987 | Satou et al. | 427/38 |
| 4,731,303 | 3/1988 | Hirano | 428/701 |
| 5,015,265 | 5/1991 | Corrigan et al. | 51/309 |
| 5,024,680 | 6/1991 | Chen et al. | 51/295 |
| 5,104,422 | 4/1992 | St. Pierre | 51/295 |
| 5,106,392 | 4/1992 | Slutz et al. | 51/295 |
| 5,139,537 | 8/1992 | Julien | 51/309 |
| 5,173,091 | 12/1992 | Marek | 51/295 |

FOREIGN PATENT DOCUMENTS

| | | |
|---|---|---|
| 0209137 | 1/1987 | European Pat. Off. |
| 0454114A1 | 10/1991 | European Pat. Off. |
| 0449571A1 | 10/1991 | European Pat. Off. |
| 2541432 | of 0000 | Germany. |
| 3144192A1 | of 0000 | Germany. |
| 3841730A1 | 3/1989 | Germany. |
| 61-41768 | 1/1987 | Japan. |

*Primary Examiner*—A. A. Turner
*Attorney, Agent, or Firm*—Herbert Dubno

[57] ABSTRACT

For the improvement of the wear properties of tools with cutting edge of cubic boron nitride (CBN) or polycrystalline cubic boron nitride (PCBN) it is proposed to coat the CBN or PCBN body with a 0.5 to 6 μm thick layer of one or more oxides of the metals zirconium and/or yttrium and/or magnesium and/or titanium and/or aluminum, preferably aluminum oxide. The wear-resistant coating is deposited from the gas phase at gas-phase temperatures up to 800° C. Preferably for the coating the pulse-plasma CVD process is used. The so-coated tools are particularly suitable for the chip-forming precision machining of hard iron and hard steel materials.

11 Claims, No Drawings

TOOL WITH WEAR-RESISTANT CUTTING EDGE MADE OF CUBIC BORON NITRIDE OR POLYCRYSTALLINE CUBIC BORON NITRIDE, A METHOD OF MANUFACTURING THE TOOL AND ITS USE

CROSS REFERENCE TO RELATED APPLICATION

This application is a national phase of PCT/DE92/00608 filed 23 Jul. 1992 and based, in turn, upon German national application P41 26 851.2 of 14 Aug. 1991 under the International Convention.

FIELD OF THE INVENTION

The present invention relates to a tool with a wear-resistant cutting edge made of cubic boron nitride or polycrystalline cubic boron nitride, whereby at least the surface of the tool is entirely or partially made of cubic boron nitride or polycrystalline cubic boron nitride. The invention also relates to a method of manufacture of the tool, as well as to its use.

BACKGROUND OF THE INVENTION

It has been long known to use tools of polycrystalline cubic boron nitride (PCBN) for the machining of particularly hard materials, for instance hard iron and steel materials, materials for cold or hot rolling, castings and the like.

In addition to the widely used monoblocks of massive PCBN, which are available in various shapes and as a rule are clamped in the tool holder, there are also PCBN cutting inserts which can be soldered to the holder (inlays). These PCBN cutting inserts have a metallized face on one side, which makes it possible to solder them into a tool holder in the tool holders, mostly through brazing at 660° C. to 840° C.

There have also been attempts to deposit cubic boron nitride (CBN) directly from the gas phase onto a substrate body through CVD (chemical vapor deposition), PVD (physical vapor deposition) or through a plasma-activated CVD process.

So for instance in EP 0 209 137 it is proposed to deposit a layer of oriented-growth cubic boron nitride (CBN) from a gas phase onto a substrate which is provided with an intermediate layer of at least one nitride and/or oxynitride of the metals aluminum, gallium, indium and tellurium.

The physical properties of CBN, particularly the high thermal stability, insures that materials which do not respond well to chip-forming machining can also be worked by turning, drilling and milling with high chip-removal volumes per time unit and considerable service life.

However, according to K. Steinmetz (VDI-Z., Volume 192 (1987), No. 2, Pages 64 to 69), it is a drawback of tools made of PCBN that considerable wear of the cutting edges occurs, especially during the finishing of workpieces made of hard iron materials, i.e. at smaller chipping cross sections, so that size, shape and surface quality requirements cannot be met.

This effect is primarily due to the high heat conductivity of tools made of PCBN or CBN.

Therefore Steinmetz suggested for such machining processes the use of a PCBN with a ceramic bonding phase. Due to the reduced heat conductivity as a result of this changed composition, a larger fraction of the machining heat is used for chip softening, so that better performance can be obtained during precision turning of hard steel parts.

From JP 61-41768 A, in Patent Abstracts of Japan, C-359, Jul. 11, 1986, Vol. 10, No. 199, it is known to deposit, by avoiding a continuous layer, separate cubic BN crystals on a hard-metal alloy substrate, a cermet substrate, or a ceramic substrate, having a height of 0.1 to 10μm and to fill the spaces free of boron nitride with carbides, nitrides, carbonitrides, borides, boron nitrides, oxides and oxycarbides of elements of the groups IVa to VIa, hexagonal BN, amorphous BN and $Al_2O_3$. However a disadvantage resides in the fact that the singular boron nitride particles are not enough to insure a good cutting effect. Furthermore thermal stress can occur during cooling, as a result of the different heat-expansion coefficients of boron nitride and $Al_2O_3$, which can lead to cracks. Finally the BN-particles tend to break away under load.

It is known to deposit wear-resistant coatings directly onto the substrate according to the CVD process through gas phase reactions at high temperatures. In addition, plasma-activated CVD processes are known, which work at lower gas-phase temperatures.

For instance DE 38 41 730 and the DE 38 41 731 describe a pulse-plasma CVD process for coating a metallic basic body with a nonconductive coating material, particularly $Al_2O_3$ wherein to the basic body which is connected as cathode a pulsed direct voltage of 200 to 900 volt with a pulse duration of 50 μs is established, whereby in the pulse pauses of 80 μs a residual voltage is maintained which is higher than the lowest ionization potential of the molecule participating in the CVD process, but not higher than 50% of the maximum voltage and wherein the coating is performed at gas-phase temperatures between 400° C. and 800° C.

OBJECTS OF THE INVENTION

It is now the object of the invention to provide a tool made of CBN or PCBN with a wear-resistant cutting edge, whose cutting-edge stability is considerably improved by avoiding the above-mentioned drawbacks.

It is a further object of the present invention to provide an improved method of manufacturing the tool according to the invention.

Finally it is the object of the present invention to provide an improved method of using the tool according to the invention.

SUMMARY OF THE INVENTION

The object of the invention is achieved by the tool according to the invention wherein a continuous CBN or PCBN layer extending over the entire tool or over a part thereof is coated with a thin layer consisting of one or more metal oxides.

The thickness of the oxide layer amounts to 0.5 to 6 μm, preferably 1 to 3 μm and/or of the CBN or PCBN layer can be up to 10 mm.

Oxides of metals such as zirconium and/or yttrium and/or magnesium and/or titanium and/or aluminum are used for the oxide layer.

Surprisingly it has been found that a tool of this design has not only exceptional wear-resistance properties, but that it is suitable for chip-forming precision machining of hard materials, particularly of hard iron and steel materials, due to its high cutting edge stability.

The individual crystals of the PCBN are bonded under high pressure into a massive body by means of a metallic bonding agent (e.g. iron, nickel, cobalt) which can also contain hard-material components (e.g. TIC). Since PCBN is largely inert, during machining the atmospheric oxygen approaching the surface of the cutting body reacts preferably with the metallic components of the bonding agent and forms oxides, e.g. (iron oxide, nickel oxide, cobalt oxide), which can no longer perform the function of a bonding agent between the CBN-grains, due to insufficient mechanical properties (e.g. ductility, wetting ability). For this reason individual CBN grains can be detached under the stress during chip removal, which diminishes the stability of the cutting edge and as a result the mechanical cutting wear is considerably increased.

The more the machining heat is diverted to the cutting body, the stronger this effect becomes. Since with the decrease of the cross section during machining the fraction of the heat which is used for chip softening diminishes, a stronger wear, respectively a lower stability of the cutting edge occurs, particularly in precision machining. This effect is additionally enhanced by the high temperatures occurring during chip removal, when machining hard iron or steel materials.

If the PCBN is covered by a thin layer of oxide, the access of the atmospheric oxygen to the bonding agent is largely prevented, so that hardly any oxides form in the metals contained in the bonding agent.

According to a particularly advantageous embodiment of the invention, the oxide layer of the invention is deposited on a massive body of PCBN (monoblock).

Finally it is also possible to coat composite bodies, which are coated with CBN, whereby between the CBN layer and the substrate there can also be a CBN-free intermediate layer, with the oxide layer according to the invention.

The intermediate layer consists of at least one nitride and/or oxynitride of the metals aluminum, gallium, indium or tellurium, preferably aluminum nitride is used.

As the substrate body, hard metals or cutting ceramics or silicon nitride or silicon-aluminum-oxynitride or cermets or tool steels are used.

The PCBN used in various embodiments of the invention contains bonding agent in a proportion of 0 to 50% by weight, preferably 10 to 25% by weight. Cobalt, nickel, tungsten and other metals, preferably cobalt, are used as bonding agents.

According to a further, particularly advantageous development of the invention the oxide layer is not deposited on the entire surface covered by CBN or PCBN, but only there where the CBN or PCBN cutting edge is actually exposed to wear, so that the PCBN, respectively the CBN layer is only partially covered by the oxide layer.

The object of the invention is further achieved through a process for the production of the tool with wear-resistant CBN or PCBN cutting edge, by applying the wear-reducing layer, consisting of one or more metal oxides onto the CBN or PCBN at gas-phase temperatures up to 800° C. Preferably the gas phase temperature ranges from 400° C. to 600° C.

Furthermore with the process of the invention it is possible to produce oxide layers which bond very well with the substrate and are fully free of cracks.

The particular advantage of the process of the invention consists in the fact that the tools with soldered or glued inlays can be coated as a complete tool, i.e. with already hardened PCBN, since in the process of the invention the gas-phase temperatures are selected so that they do not surpass the safe temperatures for the solder or adhesive.

Due to this measure, damage to the applied oxide layer is avoided during the normally required subsequent insertion.

Therefore according to the invention it is particularly advantageous to use the plasma-activated CVD process, particularly the pulse-plasma CVD process for the application of the oxide layer.

Particularly good results have been obtained with the use of the pulse-plasma CVD process for the production of the oxide layer by setting the following operating parameters:

| | |
|---|---|
| Temperature of gas phase: | 400° C. to 600° C. |
| Direct voltage: | −300 V to −600 V |
| Residual voltage: | −20 V to −60 V |
| Pulse duration: | 30 μs to 60 μs |
| Pulse pause: | 40 μs to 100 μs |

The body to be coated was connected to be the cathode. Finally the object of the invention is achieved by the use of the tool according to the invention for the chip-forming machining of hard materials, particularly of hard iron and steel materials.

According to the invention it is particularly advantageous to use the tool according to the invention as a cutting body for the precision machining of the mentioned materials.

SPECIFIC DESCRIPTION AND EXAMPLES

The object of the invention is subsequently further explained with the aid of the embodiment examples.

EXAMPLE 1

In a depression of a hard-metal indexable insert, consisting of 94% by weight tungsten carbide and 6% by weight cobalt of the shape SNUN 120404 (defined according to DIN 4987), a PCBN inlay of approximately 4×3 mm is fastened with a solder melting at 800° C.

This indexable insert was coated with $Al_2O_3$ by using the pulse-plasma CVD process according to DE 38 41 730 and 38 41 731 and with the following operating parameters:

| | |
|---|---|
| Gas phase temperature: | 600° C. |
| Gas pressure: | 250 Pa |
| Direct voltage: | −550 V |
| Residual voltage: | −40 V |
| Pulse duration: | 50 μs |
| Pulse pause: | 80 μs |
| Coating time: | 2 h |

Subsequent tests with the $Al_2O_3$-coated indexable insert have shown that the entire surface of the indexable insert, including the PCBN inlays, was coated with a 2 μm thick, securely adhering layer of finely distributed, polycrystalline $Al_2O_3$ of the alpha modification. After the coating process, the soldered-in inlay was strongly bonded with the hard-metal substrate, in unaltered condition.

Turning tests have been carried out with the indexable insert of the invention with PCBN inlay on a steel 50CrMo4 with a Rockwell hardness of 56 HRC, in continuous cutting compared with the same indexable inserts but which were not coated with $Al_2O_3$ with PCBN inlay under the following test conditions:

| | |
|---|---|
| Cutting speed | 130 m/min |
| Cutting depth | 0.5 mm |
| Advance | 0.08 mm/U. |

The turning tests were concluded when a wear mark width of 0.3 mm was reached.

In the indexable insert with PCBN inlay not coated with $Al_2O_3$ this width of the wear mark was reached already after 19 min, while the indexable inserts with PCBN inlay and $Al_2O_3$-coating showed wear-mark widths of 0.3 mm only after 48 min.

EXAMPLE 2

An indexable insert of the shape SNUN 120408 (defined according to DIN 4987), consisting of a hard metal of 94% by weight tungsten carbide and 6% by weight cobalt, was coated through a PVD process with a 8 μm thick layer of CBN and subsequently coated with aluminum oxide under the test conditions described in Example 1 by the pulse-plasma CVD process according to DE 38 41 730 and DE 38 41 731.

The subsequent testing of the indexable insert so coated showed that a layer of $Al_2O_3$ with a thickness of 2μm and with strong adherence to the CBN was deposited. Through an x-ray diffraction analysis it was established that the deposit is a very finely distributed, polycrystalline aluminum oxide of the alpha modification.

The indexable insert of the invention was after that subjected to a chip-removal machining test according to Example 1 in comparison with an identical indexable insert, but which was not covered by $Al_2O_3$.

The wear-mark width of 0.3 mm appeared after 20 min in the indexable insert not coated with $Al_2O_3$, but coated only with CBN, while in the indexable insert of the invention additionally coated with $Al_2O_3$ a corresponding wear mark appeared only after a use of 34 min.

We claim:

1. A cutting tool, comprising:
    a tool holder;
    a solid cutting body on said tool holder having a cutting edge on a surface of said body adapted to be pressed into cutting engagement with a workpiece to be machined, said cutting body being composed of a substrate selected from the group which consists of hard metal, a cutting ceramic, silicon nitride, silicon aluminum oxynitride, a cermet and tool steel, an initial layer on said substrate of a material selected from the group which consists of cubic boron nitride and polycrystalline cubic boron nitride, said initial layer having a thickness up to 10 μm; and
    a dense, crack-free fine-crystalline oxide layer of a thickness of substantially 0.5 to 6μm on said cutting body overlying said initial layer on said surface of said cutting body formed with said edge, and covering at least part of said surface, said oxide layer consisting of at least one layer of a metal oxide.

2. The tool defined in claim 1 wherein said oxide layer consists of a layer of at least one oxide of a metal selected from the group which consists of magnesium, yttrium, titanium, zirconium and aluminum.

3. The tool defined in claim 2 wherein said oxide layer consists of aluminum oxide.

4. The tool defined in claim 3 wherein said surface of said cutting body is covered by said oxide layer only in areas exposed to wear.

5. The tool defined in claim 1 wherein said oxide layer is applied to a substrate coated with cubic boron nitride on at least one cutting edge.

6. The tool defined in claim 5 wherein said cubic boron nitride is applied to an intermediate layer on said substrate and free from a cubic boron nitride.

7. The tool defined in claim 1 wherein said body is a polycrystalline cubic boron nitride insert received in a support of tungsten carbide bonded with cobalt.

8. A process for making a tool which comprises the steps of:
    (a) forming a one-piece solid cutting body adapted to be pressed into cutting engagement with a workpiece to be machined, said cutting body being composed of a substrate selected from the group which consists of hard metal, a cutting ceramic, silicon nitride, silicon aluminum oxynitride, a cermet and tool steel, an initial layer on said substrate of a material selected from the group which consists of cubic boron nitride and polycrystalline cubic boron nitride, said body forming a cutting edge, said initial layer having a thickness up to 10 μm;
    (b) applying a dense, crack-free fine-crystalline oxide layer of a thickness of substantially 0.5 to 6 μm on said cutting body overlying said initial layer on at least a portion of a surface of said cutting body formed with said edge by deposition from a gas phase at a low gas phase temperature range up to 800° C., said oxide layer consisting of at least one layer of a metal oxide selected from the group which consists of magnesium, yttrium, titanium, zirconium and aluminum; and
    (c) mounting said body with said oxide layer thereon on a tool holder.

9. The process defined in claim 8 wherein said temperature is between 400° C. and 600° C.

10. The process defined in claim 8 wherein said oxide layer is deposited by pulse-plasma chemical vapor deposition.

11. A method of machining a hard workpiece comprising the steps of:
    (a) forming a cutting tool with a wear-resistant cutting edge by
        (a1) forming a one-piece solid cutting body adapted to be pressed into cutting engagement with a workpiece to be machined, said cutting body being composed of a substrate selected from the group which consists of hard metal, a cutting ceramic, silicon nitride, silicon aluminum oxynitride, a cermet and tool steel, an initial layer on said substrate of a material selected from the group which consists of cubic boron nitride and polycrystalline cubic boron nitride, said body forming a cutting edge, said initial layer having a thickness up to 10 μm;
        (a2) applying a dense, crack-free fine-crystalline oxide layer of a thickness of substantially 0.5 to 6 μm on said cutting body overlying said initial layer on at least a portion of a surface of said cutting body formed with said edge by deposition from a gas phase at a low gas phase temperature range up to 800° C., said oxide layer consisting of at least one layer of a metal oxide selected from the group which consists of magnesium, yttrium, titanium, zirconium and aluminum; and
        (a3) mounting said body with said oxide layer thereon on a tool holder; and
    (b) machining said hard workpiece with said cutting body.

* * * * *